United States Patent
Sawase et al.

(10) Patent No.: US 7,187,017 B2
(45) Date of Patent: Mar. 6, 2007

(54) IMAGE SENSOR AND METHOD FOR FORMING ISOLATION STRUCTURE FOR PHOTODIODE

(75) Inventors: Kensuke Sawase, Kyoto (JP); Yuji Matsumoto, Kyoto (JP); Kiyotaka Sawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/544,903

(22) PCT Filed: Jun. 30, 2004

(86) PCT No.: PCT/JP2004/009589

§ 371 (c)(1),
(2), (4) Date: Aug. 10, 2005

(87) PCT Pub. No.: WO2005/001939

PCT Pub. Date: Jan. 6, 2005

(65) Prior Publication Data

US 2006/0145202 A1 Jul. 6, 2006

(30) Foreign Application Priority Data

Jun. 30, 2003 (JP) .............................. 2003-188394

(51) Int. Cl.
 *H01L 27/148* (2006.01)
 *H01L 29/768* (2006.01)

(52) U.S. Cl. ................. 257/222; 257/E31.11
(58) Field of Classification Search ................. 257/230, 257/231, 232, 233, 237, 243, 244, 252, 222, 257/225; 438/22, 24, 57, 424, 435; 250/200

See application file for complete search history.

(56) References Cited

U.S. PATENT DOCUMENTS

| | | | |
|---|---|---|---|
| 6,551,902 B1 | 4/2003 | Eibel et al. | 438/425 |
| 2003/0057431 A1 | 3/2003 | Kozuka et al. | 257/99 |
| 2003/0197190 A1* | 10/2003 | Asano et al. | 257/98 |
| 2004/0251511 A1* | 12/2004 | Desko et al. | 257/499 |
| 2006/0097134 A1* | 5/2006 | Rhodes | 250/214.1 |
| 2006/0180885 A1* | 8/2006 | Rhodes | 257/432 |

FOREIGN PATENT DOCUMENTS

| | | |
|---|---|---|
| JP | 63-88862 | 4/1988 |
| JP | 2-105460 | 4/1990 |
| JP | 7-86389 | 3/1995 |
| JP | 9-213917 | 8/1997 |

(Continued)

*Primary Examiner*—W. David Coleman
(74) *Attorney, Agent, or Firm*—Rabin & Berdo, PC

(57) ABSTRACT

An image sensor provided with: a plurality of photodiodes arranged on a surface of a semiconductor substrate, the photodiodes each including a first region of a first conductivity type provided on the semiconductor substrate, a second region of a second conductivity type provided on the first region, the second conductivity type being different from the first conductivity type, and a signal extraction region of the second conductivity type provided on the second region; and an isolation region which electrically isolates the second regions of each adjacent pair of photodiodes from each other, the isolation region including a first trench provided between the second regions of the adjacent photodiodes and an oxide film provided on the first trench in the vicinity of surfaces of the second regions and having a greater width than the first trench.

20 Claims, 9 Drawing Sheets

FOREIGN PATENT DOCUMENTS

| | | |
|---|---|---|
| JP | 2000-515321 | 11/2000 |
| JP | 2003-312024 | 11/2000 |
| JP | 2002-57319 | 2/2002 |
| JP | 2002-164567 | 6/2002 |
| JP | 2003-7993 | 1/2003 |

* cited by examiner

IMAGE SENSOR AND METHOD FOR FORMING ISOLATION STRUCTURE FOR PHOTODIODE

BACKGROUND OF THE INVENTION

1. Field of the Invention

The present invention relates to an image sensor including a plurality of photodiodes, and to a method for forming an isolation structure for photodiodes provided in an image sensor.

2. Description of Related Art

Image sensors typically include a plurality of photodiodes, and are generally capable of determining a light amount distribution with respect to the arrangement of the photodiodes. The photodiodes are each adapted to generate photovoltaic power according to the amount of received light.

In order to determine the amounts of light received by the respective photodiodes in such an image sensor, electric currents caused by the photovoltaic power generated by the respective photodiodes should independently be extracted. To this end, an isolation portion is provided between each two adjacent photodiodes to prevent an electric current from flowing between the adjacent photodiodes.

Japanese Unexamined Patent Publication No. 2000-312024 discloses an image sensor which has an isolation portion including a LOCOS (localized oxidation of silicon) isolation region and a P-type region provided on an N-type silicon semiconductor substrate. The image sensor is constructed so that a reverse bias voltage is generated between the P-type region and a semiconductor region or the semiconductor substrate to prevent an electric current from flowing between the adjacent photodiodes.

However, where the P-type region of the isolation portion is formed by diffusion of an impurity, a carrier is generated by light incident on the isolation portion, and flows into the adjacent photodiodes. Therefore, the amounts of light received by the respective photodiodes cannot accurately be determined. To avoid this problem, the area of the isolation portion is sufficiently increased for suppression of the flow of an unwanted electric current. However, this increases the area of each of the photodiodes, making it impossible to increase the integration density of the photodiodes. If the size of the photodiode is to be kept unchanged, the light receiving area of the photodiode is reduced. That is, the proportion of the total light receiving area of the photodiodes on the semiconductor substrate is reduced.

On the other hand, Japanese Unexamined Patent Publication No. 9-213917 (1997) discloses an image sensor which includes a dielectric isolation region formed by filling polysilicon in a trench having an oxidized interior surface for preventing an electric current from flowing between adjacent photodiodes.

However, there is a possibility that semiconductor surfaces of the photodiodes have defects. Therefore, where a trench (dielectric isolation region) having a smaller width is provided alone as the isolation portion, it is impossible to reduce a leak electric current occurring in the semiconductor surfaces of the photodiodes.

Further, where the isolation portion of either of the aforesaid types is provided, a depletion layer is liable to spread into the defective semiconductor surfaces It is impossible to prevent the influence of the depletion layer on the adjacent photodiodes, resulting in variations in the electrical characteristics of the image sensor.

With the provision of the isolation portion defined by the trench, carriers are liable to be trapped by defective potentials present around the trench to remain as residual charges. The residual charges thereafter influence the amounts of the electric currents generated by the respective photodiodes. Where the photodiodes of the image sensor first read a bright portion of an original image and then a dark portion, for example, carriers occurring during the reading of the bright portion partly remain as residual charges. When the dark portion is thereafter read, the electric currents (output signals) generated by the photodiodes are varied by the residual charges. This makes it impossible to accurately measure light amounts for the dark portion.

SUMMARY OF THE INVENTION

It is an object of the present invention to provide an image sensor which has a light receiving area increased without increasing the total size of photodiodes thereof.

It is another object of the present invention to provide an image sensor in which a depletion layer is prevented from spreading into defective regions.

It is further another object of the present invention to provide an image sensor which reduces the influence of residual charges on output signals.

It is further another object of the present invention to provide a method for forming a photodiode isolation structure, which can increase a light receiving area without increasing the total size of photodiodes.

According to a first aspect of the present invention, there is provided an image sensor, which comprises: a plurality of photodiodes arranged on a surface of a semiconductor substrate, the photodiodes each including a first region of a first conductivity type provided on the semiconductor substrate, a second region of a second conductivity type provided on the first region, the second conductivity type being different from the first conductivity type, and a signal extraction region of the second conductivity type provided on the second region; and an isolation region which electrically isolates the second regions of each adjacent pair of photodiodes from each other, the isolation region including a first trench provided between the second regions of the adjacent photodiodes and an oxide film provided on the first trench in the vicinity of surfaces of the second regions and having a greater width than the first trench.

According to this inventive aspect, the isolation region includes the first trench as well as the oxide film having a greater width (as measured along the semiconductor substrate) than the first trench. The provision of the isolation region having such a structure can reduce a leak electric current flowing between the second regions of the adjacent photodiodes.

The first trench can be formed in a narrowly limited region, since the formation of the first trench is achieved, for example, by etching (e.g., reactive ion etching) through a mask having a predetermined opening pattern. Where the semiconductor substrate is composed of silicon, for example, the oxide film can be formed in a narrowly limited region by a LOCOS (localized oxidation of silicon) technique by which the formation of the oxide film in the predetermined region is achieved by selective oxidation of silicon.

Unlike the isolation portion formed by the diffusion of an impurity, the isolation region is free from a carrier which may otherwise be generated by light incident thereon. Hence, there is no need to increase the area of the isolation region for suppression of the influence of the carrier. Therefore, the light receiving area (the proportion of the total light receiving area of the photodiodes on the semiconductor substrate) can be increased without increasing the total size of the photodiodes. That is, the total effective area of pixels can be increased.

Since the provision of the isolation region having the aforesaid structure reduces a parasitic capacitance as compared with the provision of the isolation portion formed by the diffusion of the impurity, a higher speed operation can be ensured. Where the higher speed operation is required with the increase of the resolution of the image sensor in the future, the aforesaid structure of the isolation region is optimum.

The photodiodes may each be constructed so that a signal generated therein according to the amount of received light is extracted through the signal extraction region.

The image sensor may further comprise third regions of the first conductivity type each provided between the second region and the oxide film for permitting a depletion layer to spread only outside a predetermined region adjacent to the oxide film when a reverse bias voltage having a predetermined magnitude is applied to each of the photodiodes.

With this arrangement, the third regions each prevent the depletion layer from spreading into the predetermined region adjacent to the oxide film. In the vicinity of the oxide film, the third regions having the conductivity type different from that of the second region are present between the second regions of the adjacent photodiodes. There is a possibility that defects occur in regions adjacent to the oxide film when the oxide film (e.g., a LOCOS oxide film) is formed. Without the provision of the third regions, the depletion layer is liable to spread into the defective regions, resulting in variations in the electrical characteristics of the image sensor.

Where the image sensor is constructed so that a reverse bias voltage is also applied to PN junctions between the second regions and the third regions when the reverse bias voltage is applied to the photodiodes, the third regions having a proper impurity concentration can prevent the depletion layer from spreading into such regions. In other words, the third regions each have an impurity concentration such as to prevent the depletion layer from spreading into the predetermined region adjacent to the oxide film when the predetermined voltage is applied to each of the photodiodes.

According to a second aspect of the present invention, there is provided an image sensor, which comprises: a plurality of photodiodes arranged on a surface of a semiconductor substrate, the photodiodes each including a first region of a first conductivity type provided on the semiconductor substrate, a second region of a second conductivity type provided on the first region, the second conductivity type being different from the first conductivity type, and a signal extraction region of the second conductivity type provided on the second region; and an isolation region which electrically isolates the second regions of each adjacent pair of photodiodes from each other, the isolation region including a first trench provided between the second regions of the adjacent photodiodes and a second trench provided on the first trench in the vicinity of surfaces of the second regions and having a greater width than the first trench.

In the image sensor according to this inventive aspect, the second trench is provided instead of the oxide film provided in the image sensor according to the first inventive aspect. The second trench may have a depth such as not to extend through the second region. Even in this case, the provision of the second trench having a sufficiently great width can reduce a leak electric current flowing between the adjacent photodiodes.

The second trench can be formed in a narrowly limited region, since the formation of the second trench is typically achieved by etching (e.g., reactive ion etching) through a mask having a predetermined opening pattern. Therefore, the light receiving area can be increased correspondingly to the reduction of the area of the isolation region.

The second trench may have, for example, an STI (shallow trench isolation) structure, which is typically employed for CMOS (complementary metal oxide semiconductor) isolation.

Silicon oxide may be filled in the second trench. In this case, the filling of silicon oxide in the second trench may be achieved, for example, by a CVD method. At this time, silicon oxide deposited outside the second trench may be removed by planarizing the surface of the semiconductor substrate by a reactive ion etching method and a CMP (chemical mechanical polishing) method.

The photodiodes may each be constructed so that a signal generated therein according to the amount of received light is extracted through the signal extraction region.

The image sensor may further comprise a depletion layer limiting region of the first conductivity type provided between the second region and the first trench for permitting a depletion layer to spread only outside a predetermined region adjacent to the first trench when a reverse bias voltage having a predetermined magnitude is applied to each of the photodiodes.

According to a third aspect of the present invention, there is provided an image sensor, which comprises: a plurality of photodiodes arranged on a surface of a semiconductor substrate, the photodiodes each comprising a first region of a first conductivity type provided on the semiconductor substrate, a second region of a second conductivity type provided on the first region, the second conductivity type being different from the first conductivity type, and a signal extraction region of the second conductivity type provided on the second region; an isolation region which electrically isolates the second regions of each adjacent pair of photodiodes from each other, the isolation region comprising a first trench provided between the second regions of the adjacent photodiodes; and a depletion layer limiting region of the first conductivity type provided between the second region and the first trench for permitting a depletion layer to spread only outside a predetermined region adjacent to the first trench when a reverse bias voltage having a predetermined magnitude is applied to each of the photodiodes.

According to this inventive aspect, the depletion layer limiting region is provided between the second region and the first trench, whereby the depletion layer is prevented from spreading into the predetermined region adjacent to the first trench when the reverse bias voltage having the predetermined magnitude is applied to each of the photodiodes.

The predetermined region adjacent to the first trench may be located in a region having defective potentials present around the first trench. In this case, the depletion layer is prevented from spreading into the region having the defective potentials. This eliminates the possibility that carriers are trapped by the defective potentials to remain as residual charges, so that output signals of the photodiodes are not influenced by the residual charges.

The first trench may have a DTI (deep trench isolation) structure which is typically employed for a bipolar transistor production process.

The image sensor may further comprise a power source for applying a reverse bias voltage to the photodiodes.

With this arrangement, the second regions of the respective photodiodes can be depleted by applying the reverse bias voltage to the photodiodes. Thus, the photodiodes each generate greater photovoltaic power for the same light amount, and have a reduced capacitance.

It is preferred that the second regions of the respective photodiodes are substantially completely depleted when a reverse bias voltage having a predetermined magnitude is applied to the photodiodes by the power source. At this time, the photodiodes each generate maximum photovoltaic power (photoelectric current) for the same light amount, and have a minimum capacitance.

The second regions of the respective photodiodes each have a proper thickness and a proper impurity concentration profile, whereby the second regions can substantially completely be depleted when the reverse bias voltage of the predetermined magnitude is applied to the photodiodes.

The image sensor may further comprise a first region electrode provided on the surface of the semiconductor substrate provided with the photodiodes outside a photodiode arrangement region in which the photodiodes are arranged, the first region electrode being electrically connected to the first regions of the respective photodiode.

With this arrangement, the first region electrode and second region electrodes (electrodes electrically connected to the signal extraction regions) of the photodiodes can be provided on the same side of the semiconductor substrate (provided with the photodiodes). In this case, the resistances of paths extending from the first regions to the first region electrode can be reduced by providing the first region electrode for the photodiodes in the vicinity of the photodiodes. Thus, a signal delay can be suppressed.

In this case, the first regions of the respective photodiodes may electrically be connected to the first region electrode by a conductive region of the first conductivity type provided outside the photodiode arrangement region.

The first regions of the respective photodiodes may be provided as a continuous first region extending across the photodiodes. For example, the first trench has a depth such as to reach a thicknesswise middle portion of the first region, so that the first region is not completely divided by the first trench.

In this case, the continuous first region serves as a common electrode shared by the plurality of photodiodes This obviates the need for providing the first region electrode for each of the photodiodes, thereby simplifying the layout.

The image sensor may further comprise a plurality of surface photodiodes each constituted by the second region and a fourth region of the first conductivity type provided on the second region.

With this arrangement, a greater photoelectric current can be generated by the photodiode constituted by the first region and the second region and the surface photodiode constituted by the second region and the fourth region.

In the image sensor, a plurality of sensor portions each constituted by the photodiode and the surface photodiode may be arranged on the surface of the semiconductor substrate, and each serve as a pixel.

The fourth regions of the respective surface photodiodes may commonly be connected.

This arrangement obviates the need for individually providing fourth region electrodes for the respective surface photodiodes, thereby simplifying the layout.

The first region electrode may be provided as extending from the region outside the photodiode (sensor portion) arrangement region into the photodiode arrangement region. In this case, the fourth regions of the respective surface photodiodes may commonly be connected by the first region electrode.

The fourth region may be configured so as to surround the signal extraction region. In this case, the signal extraction region may be disposed generally centrally of the fourth region.

With this arrangement, the area of the fourth region can be increased to increase the light receiving area of each of the surface photodiodes, whereby greater photovoltaic power can be generated by the surface photodiode.

Polysilicon may be filled in the first trench.

With this arrangement, the first trench can be filled with polysilicon (polycrystalline silicon) which is typically employed for a semiconductor process. An oxide film may be provided on an interior surface of the first trench. The polysilicon filled in the first trench may be undoped polysilicon. In these cases, a leak electric current flowing through the polysilicon can be reduced.

The filling of the polysilicon in the first trench may be achieved, for example, by a CVD (chemical vapor deposition) method. In this case, polysilicon deposited outside the first trench may be removed by planarizing the surface of the semiconductor substrate by a CMP method or by etching over the surface of the polysilicon (etching back) after the filling of the polysilicon in the first trench.

According to a fourth aspect of the present invention, there is provided a method for forming an isolation structure in an image sensor including a plurality of photodiodes each comprising a first region of a first conductivity type and a second region of a second conductivity type different from the first conductivity type for electrically isolating the second regions of the respective photodiodes from each other. The isolation structure formation method comprises the steps of: forming a semiconductor layer of the second conductivity type on a first region of the first conductivity type formed on a surface of a semiconductor substrate; forming a first trench extending through the semiconductor layer along the thickness of the semiconductor layer; and oxidizing a portion of a surface of the semiconductor layer adjacent to the first trench to form an oxide film having a greater width than the first trench, whereby the semiconductor layer is divided by an isolation region constituted by the first trench and the oxide film to form second regions.

The image sensor according to the first inventive aspect can be produced by this isolation structure formation method.

The isolation structure formation method may further comprise the step of filling a filler in the first trench.

In this case, the filler filling step may include the step of filling a semiconductor filler in the first trench. In this case, the oxide film formation step may include the step of oxidizing an upper portion of the filler filled in the first trench to form the oxide film.

According to a fifth aspect of the present invention, there is provided a method for forming an isolation structure in an image sensor including a plurality of photodiodes each comprising a first region of a first conductivity type and a second region of a second conductivity type different from the first conductivity type for electrically isolating the second regions of the respective photodiodes from each other. The isolation structure formation method comprises the steps of: forming a semiconductor layer of the second conductivity type on a first region of the first conductivity type formed on a surface of a semiconductor substrate; forming a second trench extending to a thicknesswise middle portion of the semiconductor layer in a surface of the semiconductor layer; and forming a first trench extending through the semiconductor layer along the thickness of the semiconductor layer and having a smaller width than the second trench in a region in which the second trench is formed, whereby the semiconductor layer is divided by an isolation region constituted by the first trench and the second trench to form second regions.

The image sensor according to the second inventive aspect can be produced by this isolation structure formation method.

This isolation structure formation method may further comprise the step of filling a filler in the second trench.

According to a sixth aspect of the present invention, there is provided a method for forming an isolation structure in an image sensor including a plurality of photodiodes each comprising a first region of a first conductivity type and a plurality of second regions of a second conductivity type different from the first conductivity type for electrically isolating the second regions from each other. The isolation structure formation method comprises the steps of: forming a semiconductor layer of the second conductivity type different from the first conductivity type on a first region of the first conductivity type formed on a surface of a semiconductor substrate; forming a first trench extending through the semiconductor layer along the thickness of the semiconductor layer so that the semiconductor layer is divided by an isolation region including the first trench to form second regions; and introducing an impurity of the first conductivity type between the semiconductor layer and the first trench to form a depletion layer limiting region of the first conductivity type which permits a depletion layer to spread only outside a predetermined region adjacent to the first trench when a reverse bias voltage having a predetermined magnitude is applied to each of the photodiodes.

The image sensor according to the third inventive aspect can be produced by this isolation structure formation method.

This isolation structure formation method may further comprise the step of filling a filler in the first trench.

The foregoing and other objects, features and effects of the present invention will become more apparent from the following description of the embodiments with reference to the attached drawings.

DESCRIPTION OF THE PREFERRED EMBODIMENTS

Figure 1:
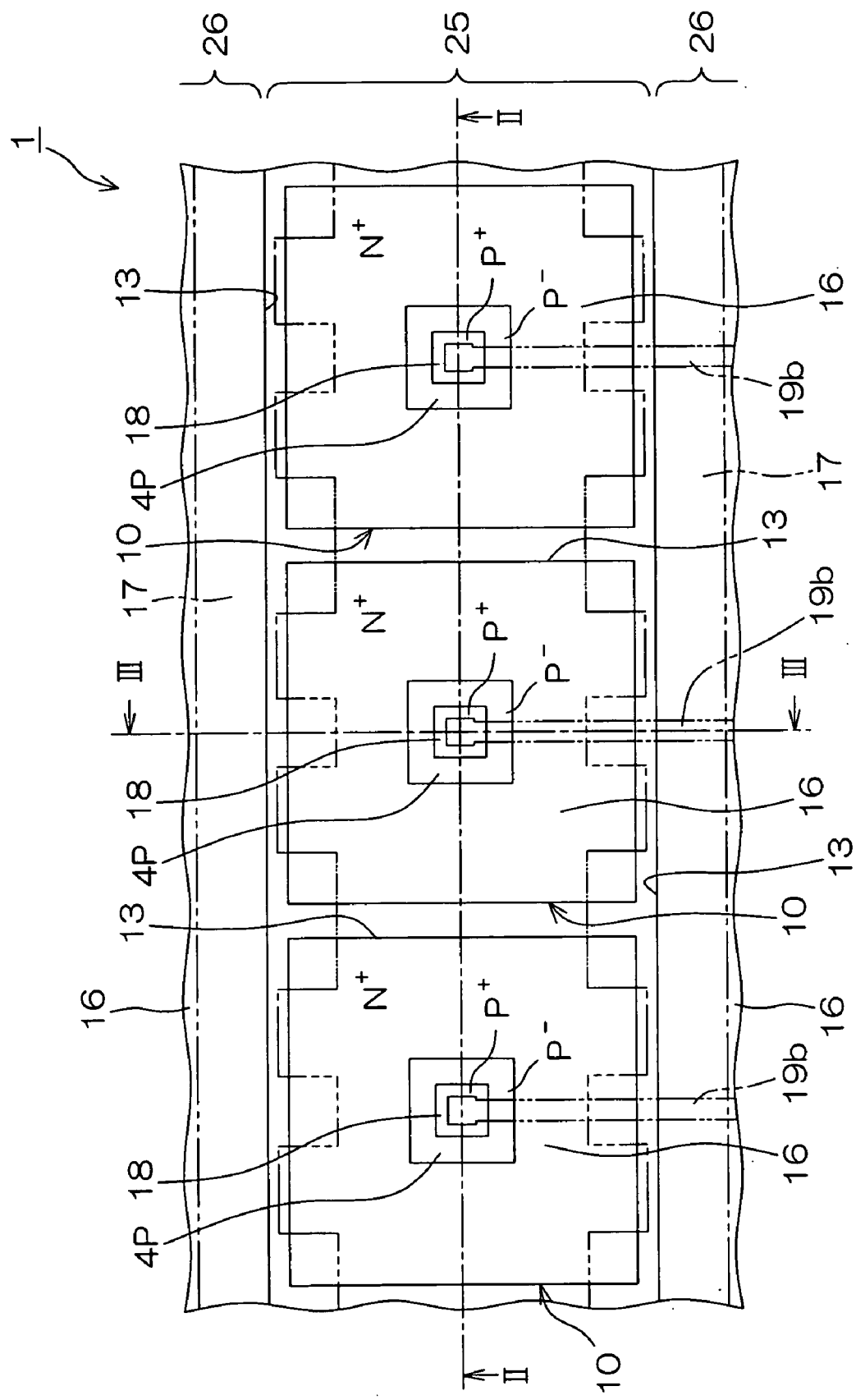
FIG. 1 is a schematic plan view of an image sensor according to a first embodiment of the present invention.
Figure 2:
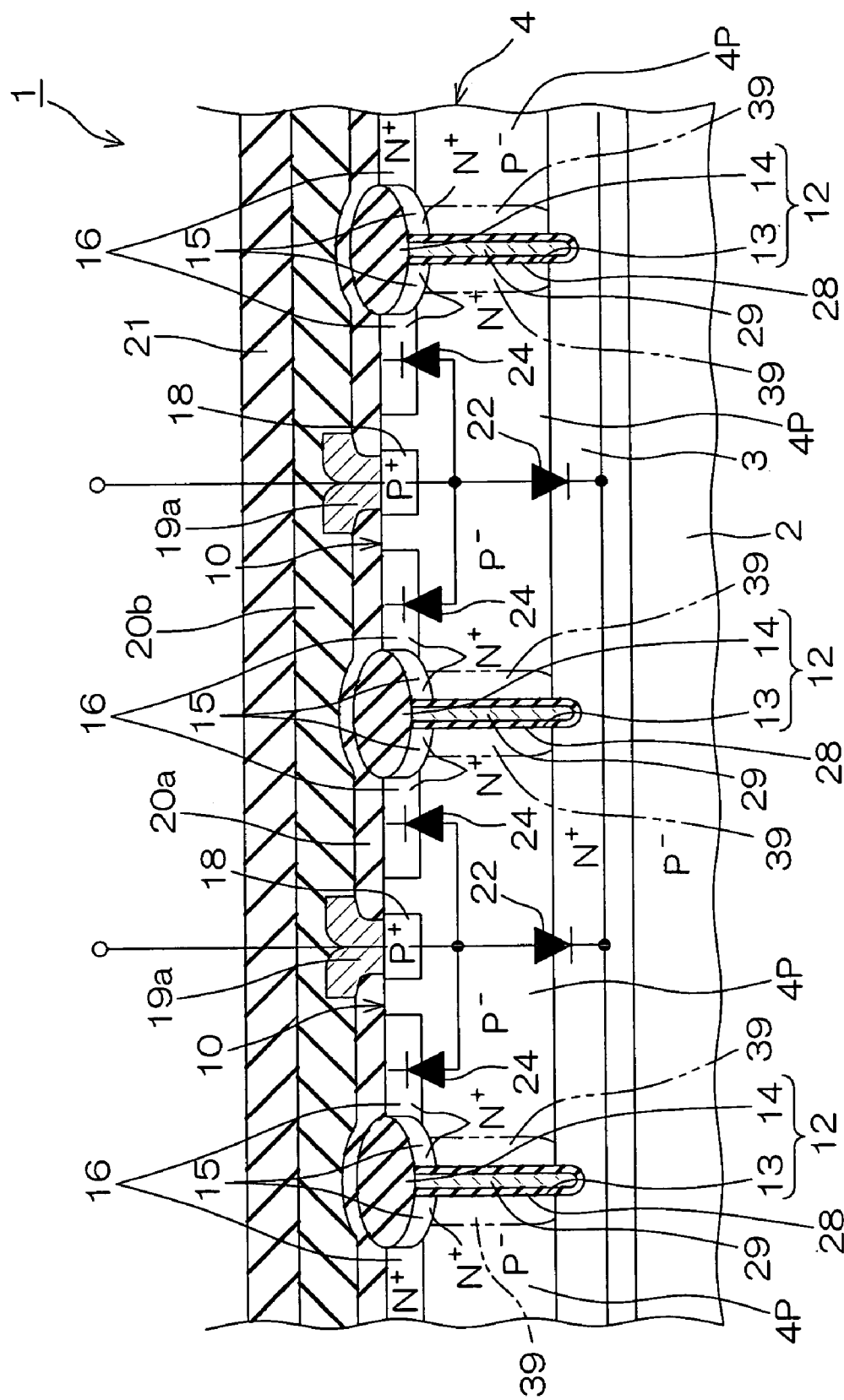
FIG. 2 is a sectional view taken along a sectional line II—II in FIG. 1.
Figure 3:
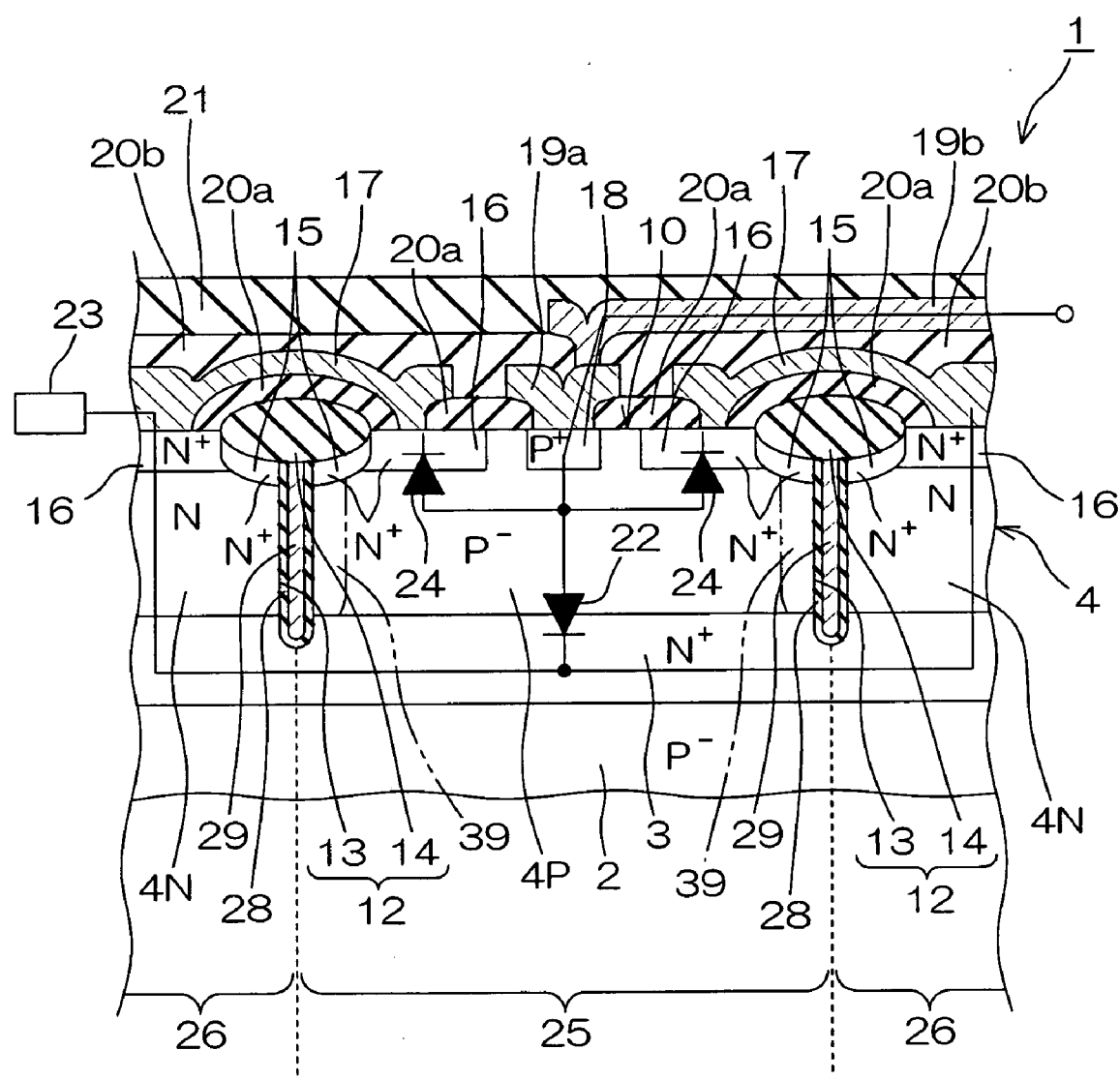
FIG. 3 is a sectional view taken along a sectional line III—III in FIG. 1.

FIG. 1 is a schematic plan view of an image sensor according to a first embodiment of the present invention. FIG. 2 is a sectional view taken along a sectional line II—II in FIG. 1, and FIG. 3 is a sectional view taken along a sectional line III—III in FIG. 1.

The image sensor 1 includes a plurality of sensor portions 10 arranged in a line or lines on a surface of a silicon substrate 2 (only a single line of sensor portions 10 is shown in FIG. 1). The sensor portions 10 respectively constitute pixels of the image sensor 1, and is each adapted to receive light and generate photovoltaic power having a magnitude according to the amount of the received light. Thus, a light amount distribution along the arrangement of the sensor portions 10 can be determined.

The silicon substrate 2 is of a $P^-$ conductivity type, and an buried layer 3 of an $N^+$ conductivity type is provided on the silicon substrate 2. Further, an epitaxial layer 4 is provided on the buried layer 3. Epitaxial layers 4P in a region 25 (hereinafter referred to as "sensor portion arrangement region") in which each line of sensor portions 10 are arranged are of the $P^-$ conductivity type, and epitaxial layers 4N in regions 26 (hereinafter referred to as "non-sensor regions") extending along opposite sides of the sensor portion arrangement region 25 outside the sensor portion arrangement region 25 are of an N conductivity type (see FIG. 3).

An isolation region 12 electrically isolates the epitaxial layers 4P of each two adjacent sensor portions 10 from each other, and electrically isolates the epitaxial layers 4P from the epitaxial layers 4N (isolates the sensor portion arrangement region 25 from the non-sensor regions 26). The epitaxial layers 4P are each defined in a generally square shape as seen perpendicular to the silicon substrate 2 by the isolation region 12. The isolation region 12 has a deep trench 13 extending through the epitaxial layer 4 to reach the buried layer 3, and a LOCOS (localized oxidation of silicon) oxide film 14 (not shown in FIG. 1).

A portion of the epitaxial layer 4 except a surface portion thereof is divided by the deep trench 13 for deep trench isolation (DTI). The deep trench 13 has a depth such as to reach a thicknesswise middle portion of the buried layer 3. That is, the buried layer 3 is not completely divided by the deep trench 13. The depth of the deep trench 13 is greater than the thickness of the epitaxial layer 4 and is, for example, on the order of several micrometers.

A silicon oxide film 28 is provided on an interior surface of the deep trench 13, and undoped polysilicon film (polycrystalline silicon film) 29 is embedded in the inside of the deep trench 13. The silicon oxide film 28 is not necessarily required to be provided on the interior surface of the deep trench 13.

The oxide film 14 is provided adjacent the surface of the epitaxial layer 4, and has a greater width than the deep trench 13 (as measured along the silicon substrate 2). That is, an isolation width provided by the isolation region 12 is greater in the surface of the epitaxial layer 4 than in the buried layer 3 and a deeper portion of the epitaxial layer 4. The width of the oxide film 14 is reduced so that the total effective area of the pixels is increased with a sufficiently great proportion of the total light receiving area of the sensor portions 10 on the silicon substrate 2.

The deep trench 13 and the oxide film 14 are configured symmetrically with respect to a common center plane perpendicular to the silicon substrate 2.

High concentration regions 15 of an $N^+$ conductivity type are provided in a region exclusive of the deep trench 13 below the oxide film 14 (on the side of the silicon substrate 2). That is, the high concentration regions 15 are disposed between the epitaxial layers 4P and the oxide film 14.

There is a possibility that defects are formed in regions adjacent to the oxide film 14 by the formation of the oxide film 14, so that the high concentration regions 15 are provided in wider regions including the defective regions.

Further, upper cathode regions 16 of the $N^+$ conductivity type are provided in portions of the surface of the epitaxial layer 4 (the surfaces of the epitaxial layers 4P and the epitaxial layers 4N) adjacent to the high concentration regions 15 (in contact with the high concentration regions 15).

The sensor portions 10 each include a photodiode 22 constituted by the epitaxial layer 4P isolated by the isolation region 12 and the buried layer 3 which serves as a lower cathode region. The sensor portions 10 each further include a surface photodiode 24 constituted by the epitaxial layer 4P and the cathode region 16.

In a center portion of each of the sensor portions 10, an anode region 18 of a $P^+$ conductivity type is provided in slightly spaced relation to the cathode region 16 in the surface of the epitaxial layer 4P. That is, the cathode region 16 surrounds the anode region 18 as seen perpendicularly to the silicon substrate 2, and the anode region 18 is disposed generally centrally of the cathode region 16.

With this arrangement, the cathode region 16 has a relatively great area, so that the surface photodiode 24 has a greater light receiving area. Thus, the surface photodiode 24 is capable of generating greater photovoltaic power.

A first silicon oxide film 20a, a second silicon oxide film 20b, a silicon nitride film 21, cathode electrodes 17 and first anode electrodes 19a extending through the first silicon oxide film 20a, and second anode electrodes 19b extending through the second silicon oxide film 20b are provided on the sensor portion arrangement region 25 and the non-sensor regions 26.

The first silicon oxide film 20a has a plurality of openings for exposing the anode regions 18 and the cathode regions 16 of the respective sensor portions 10.

The cathode electrodes 17 and the first anode electrodes 19a, which are each composed of a metal, are respectively embedded in the openings. The cathode electrodes 17 and the first anode electrodes 19a are respectively connected to the cathode regions 16 and the anode regions 18.

The cathode regions 16 in the sensor portion arrangement region 25 and the cathode regions 16 in the non-sensor regions 26 disposed on opposite sides of the oxide film 14 are electrically connected by the cathode electrodes 17. That is, the cathode electrodes 17 respectively extend from the non-sensor region 26 to the sensor portion arrangement regions 25.

As shown in FIG. 1, the cathode regions 16 of the respective sensor portions 10 are commonly connected to one of the cathode electrodes 17 on one side of the sensor portion arrangement region 25, and further commonly connected to the other cathode electrode 17 on the other side of the sensor portion arrangement region 25. Electrodes extending from the cathode regions 16 of the respective surface photodiodes 24 are not individually provided for the respective sensor portions 10, so that the layout is simplified.

The cathode electrodes 17 are isolated from the first anode electrodes 19a, and are not electrically connected to the first anode electrodes 19a.

The second silicon oxide film 20b is provided over the cathode electrodes 17, the first anode electrodes 19a and the first silicon oxide film 20a. The second silicon oxide film 20b has a plurality of openings for exposing the first anode electrodes 19a. The second anode electrodes 19b are respectively embedded in the openings of the second silicon oxide film 20b. The second anode electrodes 19b are respectively connected to the first anode electrodes 19a via the openings.

The silicon nitride film 21 is provided over the second silicon oxide film 20b and the second anode electrodes 19b. The second anode electrodes 19b are each disposed between the second silicon oxide film 20b and the silicon nitride film 21, and extend toward one of the non-sensor regions 26 disposed along the opposite sides of the arrangement of the sensor portions 10 thereby to be led to a position not shown. Further, the cathode electrodes 17 are disposed between the first silicon oxide film 20a and the second silicon oxide film 20b, and led to positions not shown.

The cathode electrodes 17 are connected to a power source 23 (see FIG. 3). The power source 23 is capable of applying a reverse bias voltage to the photodiodes 22 and the surface photodiodes 24. The impurity concentrations and thicknesses of the epitaxial layers 4P, the buried layer 3 and the cathode regions 16 of the sensor portions 10, and the layout of the cathode regions 16 of the sensor portion 10 are properly determined so that the epitaxial layers 4P are almost completely depleted when a reverse bias voltage having a predetermined magnitude is applied to the photodiodes 22 and the surface photodiodes 24.

When the image sensor 1 receives light, the reverse bias voltage of the predetermined magnitude is applied to the photodiodes 22 and the surface photodiodes 24 by the power source 23, whereby the epitaxial layers 4P are completely depleted.

When light is incident on each of the sensor portions 10, the photodiode 22 and the surface photodiode 24 each generate photovoltaic power according to the amount of the incident light. The photovoltaic power causes a photoelectric current to flow from the buried layer 3 and the cathode region 16 to the epitaxial layer 4P. Since the sensor portions 10 each include the surface photodiode 24 in addition to the photodiode 22, a greater photoelectric current is generated.

At this time, the epitaxial layer 4P is completely depleted, whereby the photodiode 22 and the surface photodiode 24 each generate a maximum photoelectric current and have a minimum capacitance for the same light amount.

Since the cathode region 16 contacts the high concentration region 15, a depletion layer spreads from an interface between the high concentration region 15 and the epitaxial layer 4P when the reverse bias voltage is applied to the photodiode 22 and the surface photodiode 24. However, the high concentration region 15 has a sufficiently high impurity concentration, so that the depletion layer does not spread into the defective region adjacent to the oxide film 14. In other words, the impurity concentration of the high concentration region 15 is high enough to prevent the depletion layer from spreading into the defective region adjacent to the oxide film 14.

Since the buried layer 3, the epitaxial layers 4N and the cathode regions 16 are of the N conductivity type, the carrier generated by the photovoltaic power of the photodiodes 22 flows from the photodiodes 22 to the cathode electrodes 17 through these N-type regions. The cathode electrodes 17 are disposed adjacent the sensor portions 10, so that paths extending from the buried layer 3 to the cathode electrodes 17 each have a reduced resistance. Thus, a signal delay can be suppressed.

The buried layer 3 is not completely divided by the deep trench 13 and, hence, serves as a common electrode shared by the plural sensor portions 10. This obviates the need for providing an electrode (cathode electrode 17) electrically connected to the buried layer 3 for each of the sensor portions 10, thereby simplifying the layout.

With the aforesaid construction, the amount of light received by each of the sensor portions 10 can be determined by measuring an electric current flowing between the cathode electrode 17 and the first and second anode electrodes 19a, 19b extending from the sensor portion 10.

Since the oxide film 14 is provided in addition to the deep trench 13, the epitaxial layers 4P of the adjacent sensor portions 10 are properly electrically isolated from each other. Further, the deep trench 13 is filled with the undoped polysilicon film 29, so that electric current leak through the polysilicon film 29 can be suppressed.

Further, the isolation region 12 constituted by the deep trench 13 and the oxide film 14 provided on the deep trench 13 generates no carrier due to the incidence of the light unlike the isolation portion formed by the diffusion of the impurity. Hence, there is no need to increase the size of the isolation region 12 for minimizing the influence of the carrier. Therefore, the light receiving area (the proportion of the total light receiving area of the photodiodes 22 and the surface photodiodes 24 on the silicon substrate 2) can be increased without increasing the total size of the photodiodes 22 and the surface photodiodes 24. That is, the total effective area of the pixels can be increased.

Since the high concentration regions 15 each prevent the depletion layer from spreading into the defective region adjacent to the oxide film 14, the electrical characteristics of the image sensor 1 does not vary.

Thus, the image sensor 1 is capable of independently extract electric currents generated in the respective sensor portions 10, so that the amounts of light received by the respective sensor portions 10 can accurately be determined.

FIGS. 4(*a*) to 4(*d*) are schematic sectional views for explaining a production method for the image sensor 1 shown in FIGS. 1 to 3, and illustrate sections taken along a sectional line III—III in FIG. 1. FIGS. 4(*a*) and 4(*b*) illustrate a region extending between two sensor portion arrangement regions 25, and FIGS. 4(*c*) and 4(*d*) illustrate one sensor portion arrangement region 25.

First, an N-type impurity is implanted into predetermined regions 27 of a P⁻-type silicon substrate 2 each corresponding to an buried layer 3 (see FIG. 4 (*a*)). After a P⁻-type epitaxial layer 4 is formed on a surface of the silicon substrate 2 on the side of the regions 27, the resulting silicon substrate 2 is heated. Thus, the N-type impurity implanted into each of the regions 27 is diffused into the silicon substrate 2 and the epitaxial layer 4, whereby the buried layer 3 is formed (see FIG. 4(*b*)).

In turn, a silicon oxide film having a predetermined opening pattern is formed on the resulting substrate, and a deep trench 13 is formed by reactive ion etching (RIE) with the use of this silicon oxide film as a mask. The deep trench 13 has a depth such as to extend through the epitaxial layer 4 to reach a thicknesswise middle portion of the buried layer 3.

Subsequently, a silicon oxide film 28 is formed on an exposed surface of the resulting substrate including the interior surface of the deep trench 13, for example, by a reduced pressure CVD (chemical vapor deposition) method. After a polysilicon film 29 is formed to fill the deep trench 13, for example, by a reduced pressure CVD method, portions of the polysilicon film 28 and the silicon oxide film 29 deposited outside the deep trench 13 are removed, for example, by a CMP (chemical mechanical polishing) method. Thus, the polysilicon film 28 is present only in the deep trench 13 as shown in FIG. 4(*c*).

Then, an impurity for controlling the N-type conductivity is introduced into portions of a surface of the resulting epitaxial layer 4 corresponding to high concentration regions 15 and their peripheral regions. Then, an upper portion of the polysilicon film in the deep trench 13 and their peripheral portion in the epitaxial layer 4 are selectively oxidized by a known LOCOS technique for formation of an oxide film 14. Thus, the isolation region 12 is provided, and the high concentration regions 15 are formed below the oxide film 14 as shown in FIG. 4(*d*).

The aforesaid steps may be based on a DTI (deep trench isolation) technique which is typically employed for a bipolar transistor production process.

Referring to FIG. 3, portions of the silicon oxide film present outside the isolation region 12 are removed, and then an N-type impurity is implanted into portions of the epitaxial layer 4 corresponding to non-sensor regions 26 with the use of a mask having a predetermined opening pattern, followed by thermal diffusion. Thus, these portions of the epitaxial layer 4 have an N-type conductivity, whereby epitaxial layers 4N are provided.

Further, cathode regions 16 and anode regions 18 are each formed by implantation and diffusion of an impurity with the use of a mask having a predetermined opening pattern.

In turn, a first silicon oxide film 20a is formed over a surface of the resulting silicon substrate 2 on the side of the epitaxial layer 4 by a CVD method or the like. Then, openings are formed in the first silicon oxide film 20a by etching through a resist film having a predetermined opening pattern, whereby predetermined portions of the cathode regions 16 and the anode regions 18 are exposed from the openings.

Subsequently, a metal film is formed over the first silicon oxide film 20a as filling the openings of the first silicon oxide film 20a by a sputtering method or the like. The metal film is electrically connected to the portions of the cathode regions 16 and the anode regions 18 exposed from the openings of the first silicon oxide film 20a. Further, the metal film is etched into a predetermined pattern. Thus, portions of the metal film connected to the cathode regions 16 are electrically isolated from portions of the metal film connected to the anode regions 18, whereby cathode electrodes 17 and first anode electrodes 19a are provided.

Thereafter, a second silicon oxide film 20b is formed over the first silicon oxide film 20a, the cathode electrodes 17 and the first anode electrodes 19a by a CVD method or the like. Then, openings are formed in the second silicon oxide film 20b by etching through a resist film having a predetermined opening pattern, whereby predetermined portions of the first anode electrodes 19a are exposed from the openings.

In turn, a metal film is formed over the second silicon oxide film 20b as filling the openings of the second silicon oxide film 20b by a sputtering method or the like. The metal film is electrically connected to the portions of the first anode electrodes 19a exposed from the openings. Further, this metal film is etched into a predetermined pattern, whereby second anode electrodes 19b are provided.

Thereafter, a silicon nitride film 21 is formed over the resulting silicon substrate 2. Thus, the image sensor 1 shown in FIG. 3 is provided.

In the aforesaid production method, the width of the deep trench 13 is determined by an opening of the mask employed for the reactive ion etching, so that the deep trench 13 can be formed in a narrowly limited region. Further, the LOCOS oxide film 14 can be formed in a narrowly limited region by selective oxidation of silicon employing anitride film as the mask. Therefore, the light receiving area (the proportion of the total light receiving area of the sensor portions 10 on the silicon substrate 2) can be increased without increasing the total size of the sensor portions 10.

In the image sensor 1 described above, an isolation region including the deep trench 13 and a shallow trench formed on the deep trench 13 and having a greater width than the deep trench 13 may be provided instead of the isolation region 12. That is, the shallow trench may be provided instead of the LOCOS oxide film 14. Where a shallow trench having a greater width than the deep trench 13 is formed adjacent the surface of the epitaxial layer 4, the epitaxial layers 4P of the adjacent sensor portions 10 can properly electrically be isolated from each other as in the case where the oxide film 14 is provided. Thus, electric current leak between the epitaxial layers 4P of the adjacent sensor portions 10 can be prevented.

Such an image sensor is produced in the following manner.

Figure 5A:
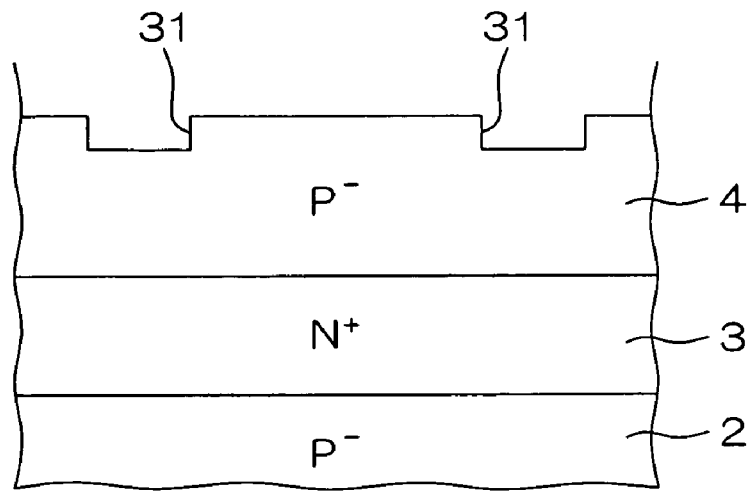
FIGS. 5(a), 5(b) and 5(c) are schematic sectional views for explaining a production method for an image sensor including an isolation region having a shallow trench instead of an isolation region provided in the image sensor shown in FIGS. 1 to 3.
Figure 5B:
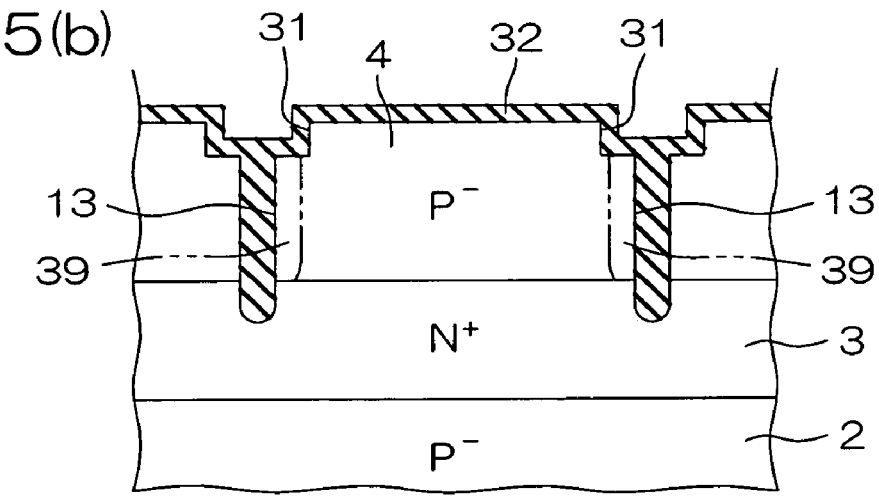
Figure 5C:
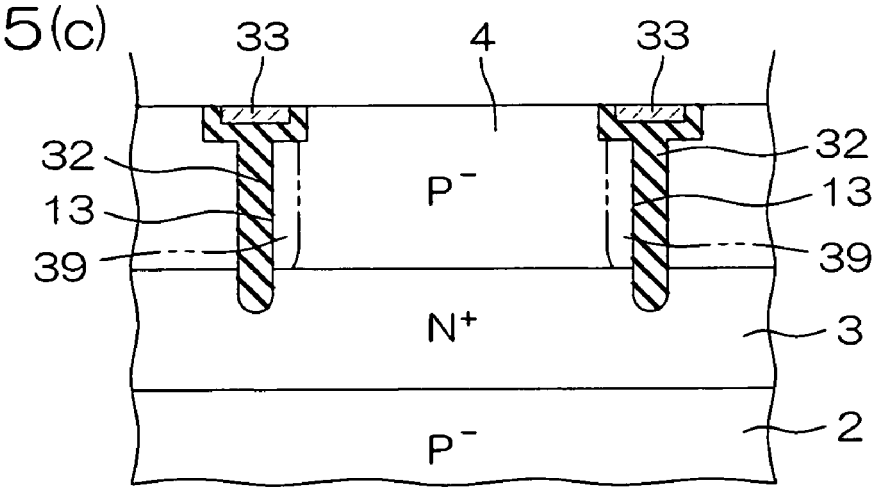

FIGS. 5(a), 5(b) and 5(c) are schematic sectional views for explaining a production method for the image sensor having the shallow trench instead of the oxide film 14 provided in the image sensor 1 shown in FIGS. 1 to 3.

Figure 4A:
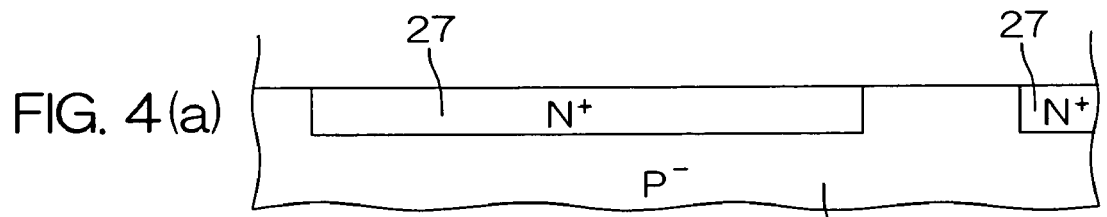
FIGS. 4(a), 4(b), 4(c) and 4(d) are schematic sectional views for explaining a production method for the image sensor shown in FIGS. 1 to 3.
Figure 4B:
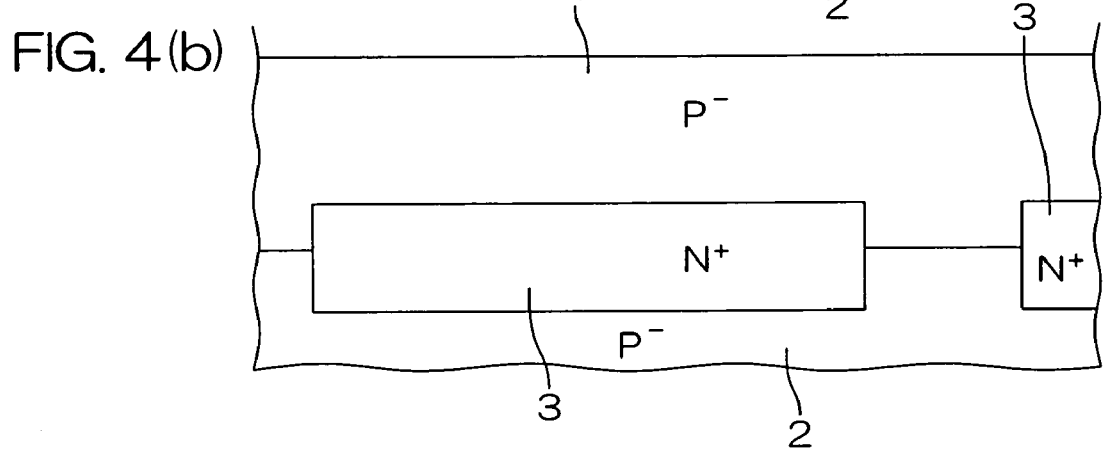
Figure 4C:
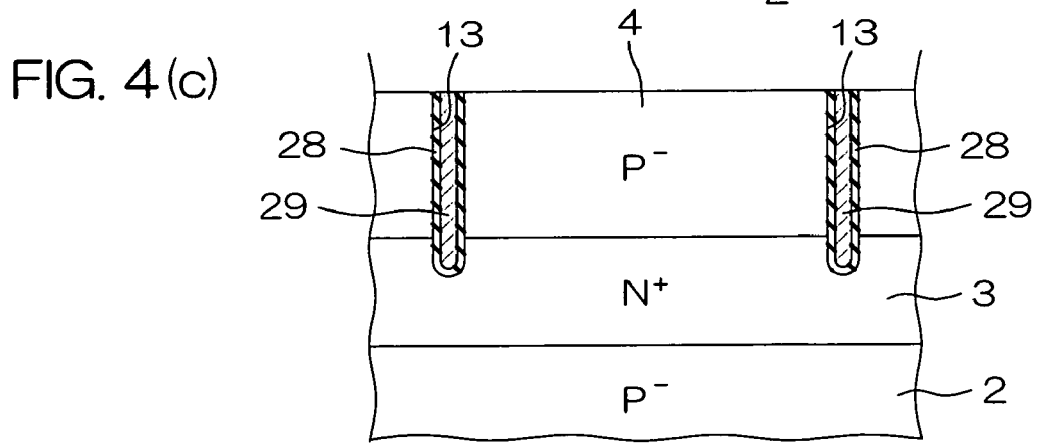
Figure 4D:
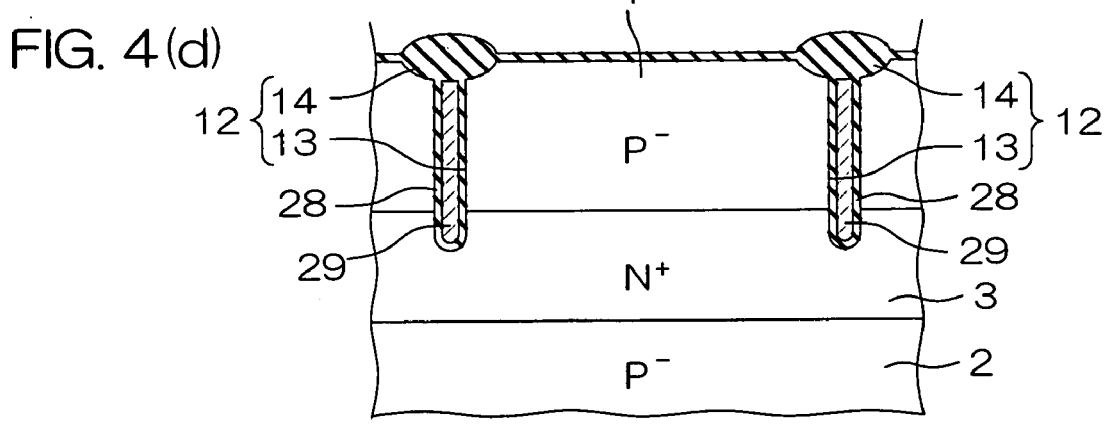

First, the step of forming the buried layer 3 (see FIG. 4(b)) and the steps precedent thereto are performed in the same manner as in the production process for the image sensor 1. Thereafter, a shallow trench 31 is formed in a portion of the surface of the epitaxial layer 4 generally corresponding to the oxide film 14 of the image sensor 1, for example, by reactive ion etching (see FIG. 5(a)). The shallow trench 31 has a depth such as not to extend through the epitaxial layer 4.

Then, a deep trench 13 is formed as extending from a widthwise middle portion of the bottom of the shallow trench 31 to a thicknesswise middle portion of the buried layer 3 by reactive ion etching through a mask having a predetermined opening pattern. Thus, the shallow trench 31 has a greater width than the deep trench 13.

Subsequently, a silicon oxide film 32 is formed over the resulting silicon substrate 2 by a reduced pressure CVD method. At this time, the silicon oxide film 32 fills the deep trench 13 but does not completely fill the shallow trench 31 as shown in FIG. 5(b).

In turn, a polysilicon film 33 is formed over the resulting silicon substrate 2. At this time, the polysilicon film 33 completely fills the shallow trench 31. Then, a surface of the resulting silicon substrate 2 formed with the polysilicon film 33 is chemically or mechanically polished, whereby portions of the silicon oxide film 32 and the polysilicon film 33 present outside the deep trench 13 and the shallow trench 31 on the epitaxial layer 4 are removed as shown in FIG. 5(c).

The aforesaid steps may be based on an STI (shallow trench isolation) technique which is typically employed for CMOS (complementary metal oxide semiconductor) isolation.

Thereafter, the step of forming the epitaxial layers 4N and the steps subsequent thereto are performed in the same manner as in the production process for the image sensor 1.

The width of the shallow trench 31 is determined by an opening of the mask employed for the reactive ion etching, so that the shallow trench 31 can be formed in a narrowly limited region. Thus, the total light receiving area of the sensor portions 10 can be increased.

Figure 6:
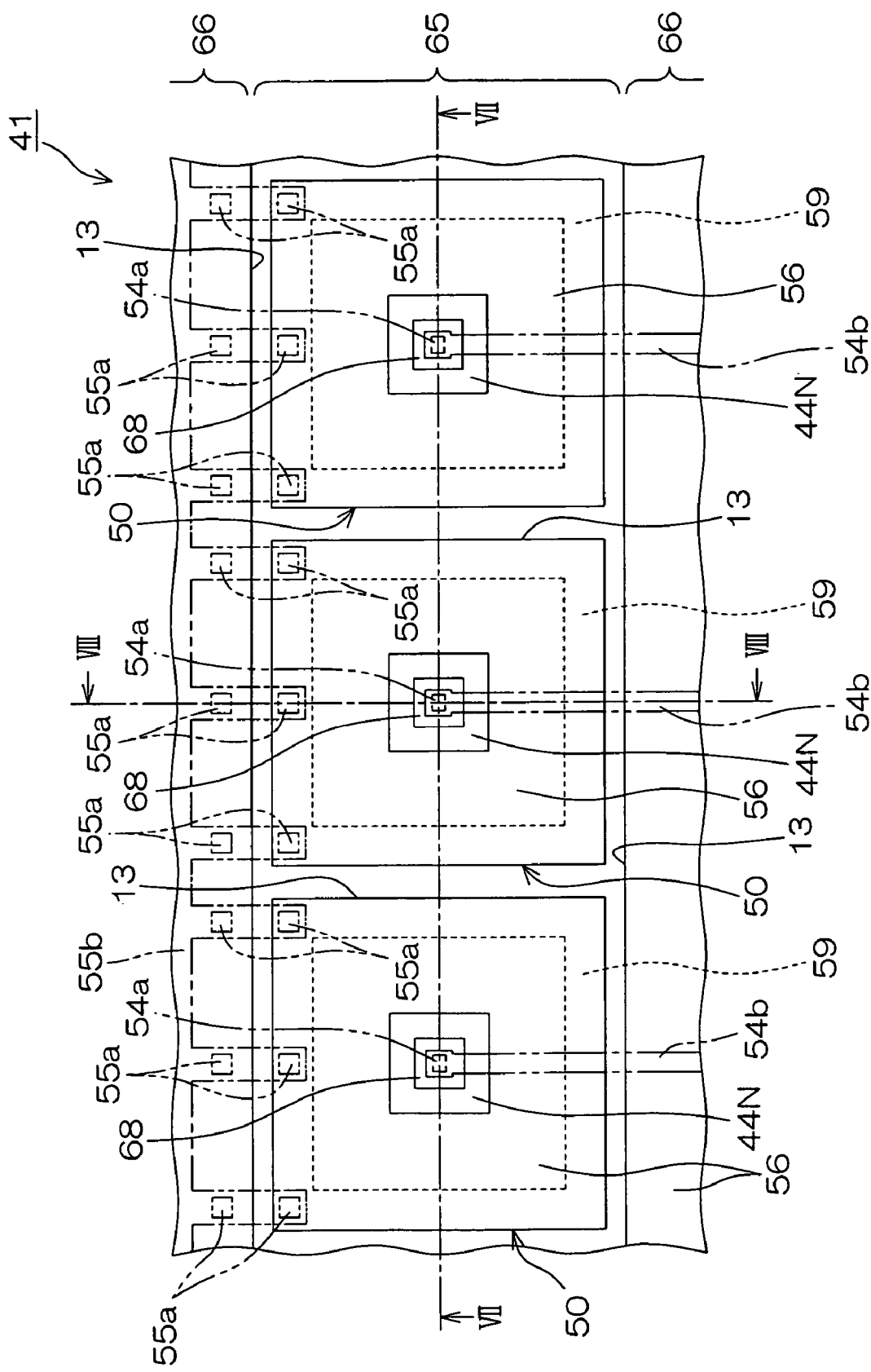
FIG. 6 is a schematic plan view of an image sensor according to a second embodiment of the present invention.
Figure 7:
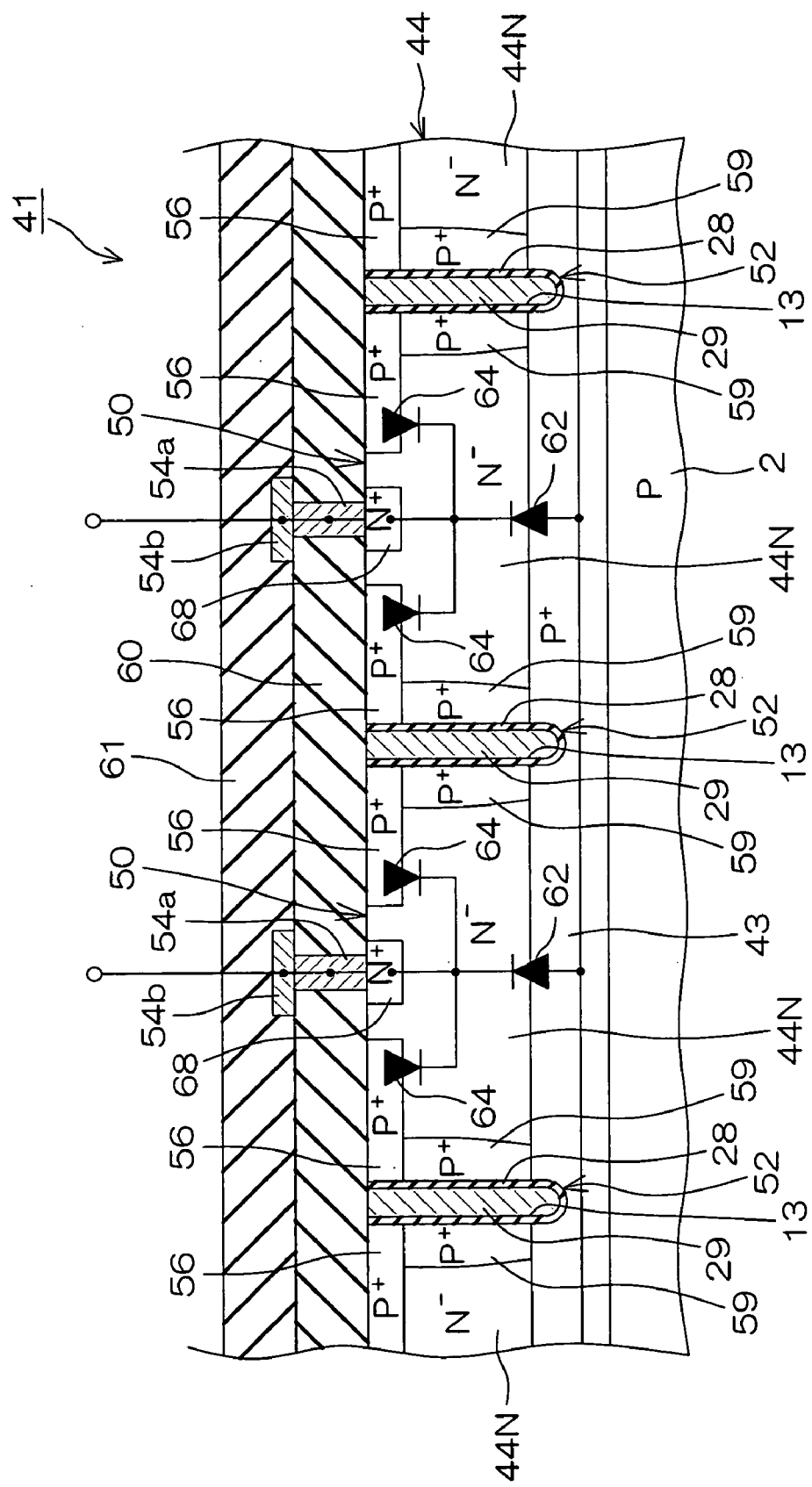
FIG. 7 is a sectional view taken along a sectional line VII—VII in FIG. 6.
Figure 8:
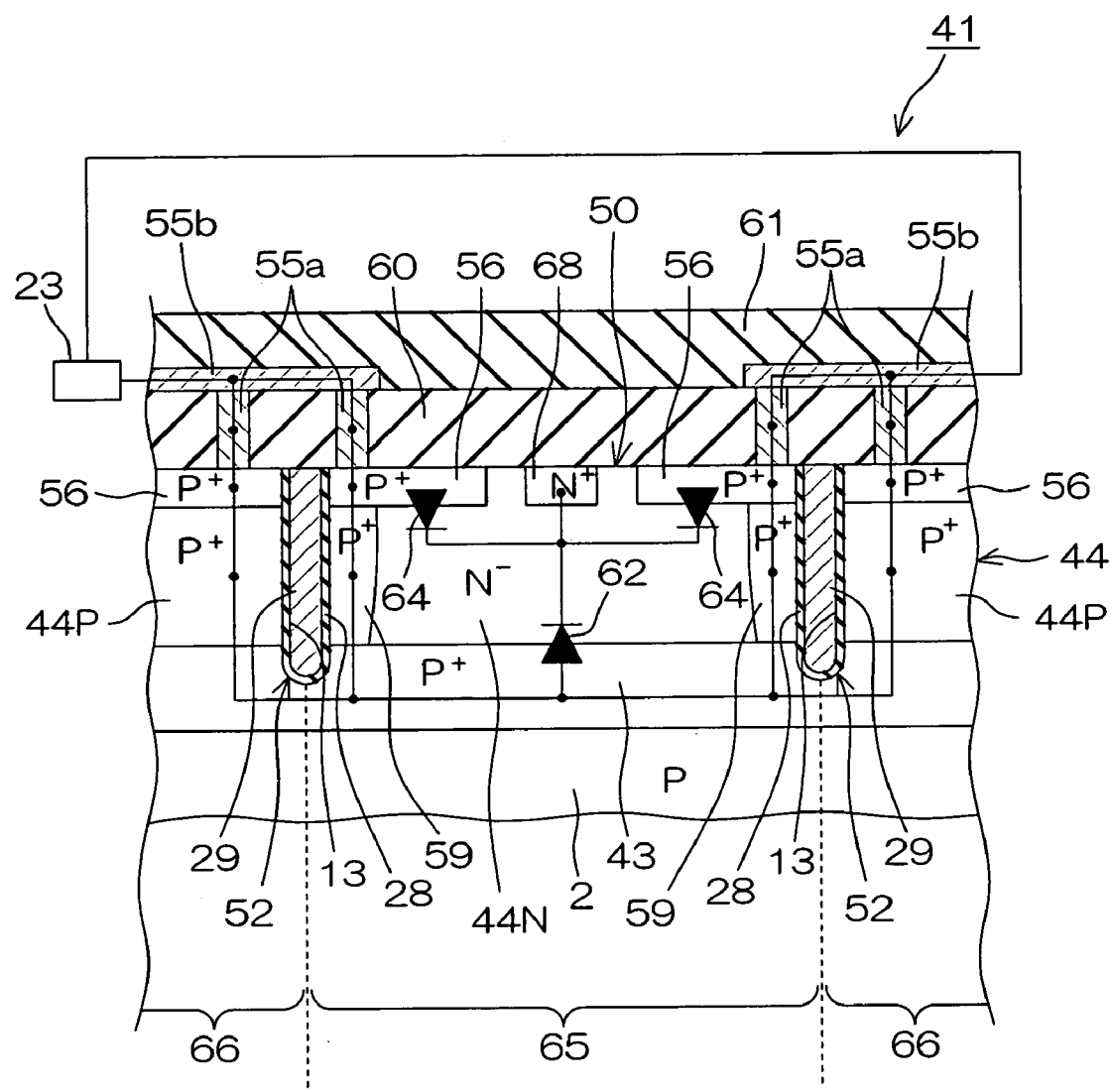
FIG. 8 is a sectional view taken along a sectional line VIII—VIII in FIG. 6.

FIG. 6 is a schematic plan view of an image sensor according to a second embodiment of the present invention. FIG. 7 is a sectional view taken along a sectional line VII—VII in FIG. 6, and FIG. 8 is a sectional view taken along a sectional line VIII—VIII in FIG. 6.

The image sensor 41 includes a plurality of sensor portions 50 arranged in a line or lines on a surface of a silicon substrate 2 (only a single line of sensor portions 50 is shown in FIG. 6). The sensor portions 50 respectively constitute pixels of the image sensor 41, and are each adapted to receive light and generate photovoltaic power having a magnitude according to the amount of the received light. Thus, a light amount distribution along the arrangement of the sensor portions 50 can be determined.

A buried layer 43 of a $P^+$ conductivity type is provided on the silicon substrate 2 which is of a P conductivity type. Further, an epitaxial layer 44 is provided on the buried layer 43. Epitaxial layers 44N in a region 65 (hereinafter referred to as "sensor portion arrangement region") in which each line of sensor portions 50 are arranged are of an $N^-$ conductivity type, and epitaxial layers 44P in regions 66 (hereinafter referred to as "non-sensor regions") extending along opposite sides of the sensor portion arrangement region 65 outside the sensor portion arrangement region 65 are of the $P^+$ conductivity type (see FIG. 8).

The buried layer 43 has an impurity concentration of, for example, about $3 \times 10^{18}$ cm$^{-3}$. The epitaxial layers 44N each have an impurity concentration of, for example, about $3 \times 10^{15}$ cm$^{-3}$, and the epitaxial layers 44P each have an impurity concentration of, for example, about $3 \times 10^{17}$ cm$^{-3}$.

An isolation region 52 electrically isolates the epitaxial layers 44N of each two adjacent sensor portions 50 from each other, and electrically isolates the epitaxial layers 44N from the epitaxial layers 44P (isolates the sensor portion arrangement region 65 from the non-sensor regions 66). The epitaxial layers 44N are each defined in a generally square shape as seen perpendicularly to the silicon substrate 2 by the isolation region 52.

The isolation region 52 has a deep trench 13 extending through the epitaxial layer 44 to reach the buried layer 43. Unlike the isolation region 12 of the image sensor 1 according to the first embodiment (see FIGS. 2 and 3), the isolation region 52 does not have the oxide film 14 having a greater width than the deep trench 13.

The epitaxial layer 44 is divided by the deep trench 13 for deep trench isolation (DTI). The deep trench 13 has a depth such as to reach a thicknesswise middle portion of the buried layer 43. That is, the buried layer 43 is not completely divided by the deep trench 13. The depth of the deep trench 13 is substantially equal to the thickness of the epitaxial layer 44 and is, for example, on the order of several micrometers.

A silicon oxide film 28 is provided on an interior surface of the deep trench 13, and an undoped polysilicon film (polycrystalline silicon film) 29 is embedded in the inside of the deep trench 13.

The deep trench 13 is configured symmetrically with respect to a common center plane perpendicular to the silicon substrate 2.

Depletion layer limiting regions 59 are provided between the deep trench 13 and the epitaxial layers 44N. Defective potentials are present in the vicinity of interfaces between the depletion layer limiting regions 59 of silicon and the silicon oxide film 28 around the deep trench 13. The depletion layer limiting regions 59 are provided more extensively as including regions in which the defective potentials are present. The depletion layer limiting regions 59 contact the buried layer 43.

The depletion layer limiting regions 59 each have an impurity concentration equivalent to the impurity concentration of the epitaxial layers 44P, for example, an impurity concentration of about $3 \times 10^{17}$ cm$^{-3}$. The epitaxial layers 44P and the depletion layer limiting regions 59 are well regions which are formed by diffusion of impurities.

Upper anode regions 56 of the P$^+$ type are provided in surface portions of the epitaxial layers 44N and the depletion layer limiting regions 59 adjacent to the depletion layer limiting regions 59 (in contact with the depletion layer limiting regions 59) and in surface portions of the epitaxial layers 44P.

The sensor portions 50 each include a photodiode 62 including the epitaxial layer 44N isolated by the isolation region 52 and the buried layer 43 which serves as a lower anode region. The sensor portions 50 each further include a surface photodiode 64 including the epitaxial layer 44N and the anode region 56.

In a center portion of each of the sensor portions 50, an N$^+$-type cathode extraction region 68 is provided in slightly spaced relation to the anode region 56 in the surface of the epitaxial layer 44N. That is, the anode region 56 surrounds the cathode extraction region 68 as seen perpendicularly to the silicon substrate 2, and the cathode extraction region 68 is disposed generally centrally of the anode region 56.

With this arrangement, the anode region 56 has a relatively great area, so that the surface photodiode 64 has a greater light receiving area. Thus, the surface photodiode 64 is capable of generating greater photovoltaic power.

A silicon oxide film 60 is provided over the sensor portion arrangement region 65 and the non-sensor regions 66, and a silicon nitride film 61 is provided over the silicon oxide film 60 (not shown in FIG. 6).

A plurality of first anode electrodes 55a each having a plug shape (columnar shape) extending through the silicon oxide film 60 are provided on the anode regions 56 in the sensor portion arrangement region 65 and the non-sensor regions 66. The first anode electrodes 55a provided in the sensor portion arrangement region 65 are disposed on the depletion layer limiting regions 59. The first anode electrodes 55a are arranged along the arrangement of the sensor portions 50. At least one first anode electrode 55a is provided for each of the sensor portions 50. A plurality of first anode electrodes 55a may be provided for each of the sensor portions 50.

First cathode electrodes 54a of a plug shape (columnar shape) extending through the silicon oxide film 60 are provided on the cathode extraction regions 68 of the respective sensor portions 50.

Second anode electrodes 55b connected to the first anode electrodes 55a and second cathode electrodes 54b respectively connected to the second cathode electrodes 54a are provided between the silicon oxide film 60 and the silicon nitride film 61. The first and second anode electrodes 55a, 55b and the first and second cathode electrodes 54a, 54b are each composed of a metal.

The second anode electrodes 55b are disposed on opposite sides of a center line of the sensor portion arrangement region 65 (see FIG. 8). In FIG. 6, first and second anode electrodes 55a, 55b on one of the opposite sides are not shown. The anode electrodes 55a in the respective sensor portions 50 and the non-sensor regions 66 are commonly connected to the second anode electrode 55b on either of the opposite sides. That is, electrodes extending from the anode regions 56 of the surface photodiodes 64 are not individually provided for the respective sensor portions 50, so that the layout is simplified.

On the other hand, the first cathode electrodes 54a of the sensor portions 50 are respectively connected to the different second cathode electrodes 54b. The second anode electrodes 55b and the second cathode electrodes 54b each extend perpendicularly to the arrangement of the sensor portions 50, and are individually extracted at positions not shown.

The second anode electrodes 55a are connected to a power source 23 (see FIG. 8). The anode regions 56 contact the depletion layer limiting regions 59 and the epitaxial layers 44P, and the depletion layer limiting regions 59 and the epitaxial layers 44P contact the buried layer 43. Further, the anode regions 56, the depletion layer limiting regions 59, the epitaxial layers 44P and the buried layer 43 are of the same conductivity type (P type). Thus, the power source 23 is capable of applying a reverse bias voltage to the photodiodes 62 and the surface photodiodes 64.

The impurity concentrations and thicknesses of the epitaxial layers 44N, the buried layer 43 and the anode regions 56 of the sensor portions 50, and the layout of the anode regions 56 are properly determined so that the epitaxial layers 44N are almost completely depleted when a reverse bias voltage having a predetermined magnitude is applied to the photodiodes 62 and the surface photodiodes 64.

When the image sensor 41 receives light, the reverse bias voltage of the predetermined magnitude is applied to the photodiodes 62 and the surface photodiodes 64 by the power source 23, whereby the epitaxial layers 44N are completely depleted.

When light is incident on each of the sensor portions 50, the photodiode 62 and the surface photodiode 64 each generate photovoltaic power according to the amount of the incident light. The photovoltaic power causes a photoelectric current to flow from the epitaxial layer 44N to the buried layer 43 and the anode region 56. Since the sensor portions 50 each include the surface photodiode 64 in addition to the photodiode 62, a greater photoelectric current is generated.

At this time, the epitaxial layer 44N is completely depleted, whereby the photodiode 62 and the surface photodiode 64 each generate a maximum photoelectric current and have a minimum capacitance for the same light amount.

The first anode electrodes 55a in the sensor portion arrangement region 65 are disposed on the depletion layer limiting regions 59, i.e., outside the epitaxial layers 44N in which carriers occur, whereby the light incident on the sensor portions 50 is not blocked by the first anode electrodes 55a but reaches the epitaxial layers 44N. Thus, the amounts of the light received by the respective sensor portions 50 are increased.

When the reverse bias voltage is applied to the photodiodes 62 and the surface photodiodes 64, depletion layers are spread from the interfaces between the depletion layer limiting regions 59 and the epitaxial layers 44N. However, the depletion layer limiting regions 59 each have a higher impurity concentration, so that the depletion layers are prevented from spreading into the regions in which the defective potentials are introduced in the vicinity of the interfaces between the depletion layer limiting regions 59 and the silicon oxide film 28 around the deep trench 13.

In other words, the impurity concentration of the depletion layer limiting regions 59 is high enough to prevent the depletion layers from spreading into the regions in which the defective potentials are introduced in the vicinity of the deep trench 13. This eliminates the possibility that carriers are trapped by the defective potentials to remain as residual charges, so that the photoelectric currents occurring in the respective sensor portions 50 are not influenced by the residual charges.

The buried layer 43 is not completely divided by the deep trench 13 and, hence, serves as a common electrode shared by the plural sensor portions 50. This obviates the need for providing an electrode (second anode electrode 55a) electrically connected to the buried layer 43 for each of the sensor portions 50, thereby simplifying the layout.

With the aforesaid arrangement, the amounts of the light received by the respective sensor portions 50 can be determined by measuring electric currents flowing between the second anode electrodes 55a and the second cathode electrodes 54b individually extending from the respective sensor portions 50. This image sensor 41 can independently extract electric currents occurring in the respective sensor portions 50 and, hence, accurately measure the amounts of the light received by the respective sensor portions 50.

Figure 9A:
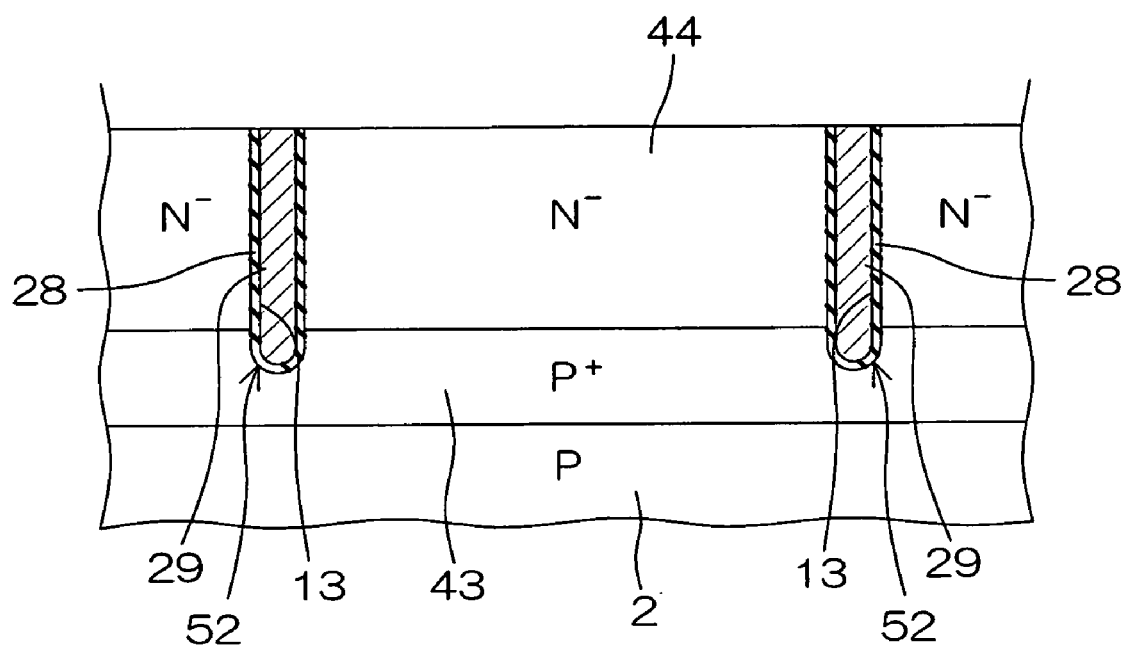
FIGS. 9(a) and 9(b) are schematic sectional views for explaining a production method for the image sensor shown in FIGS. 6 to 8.
Figure 9B:
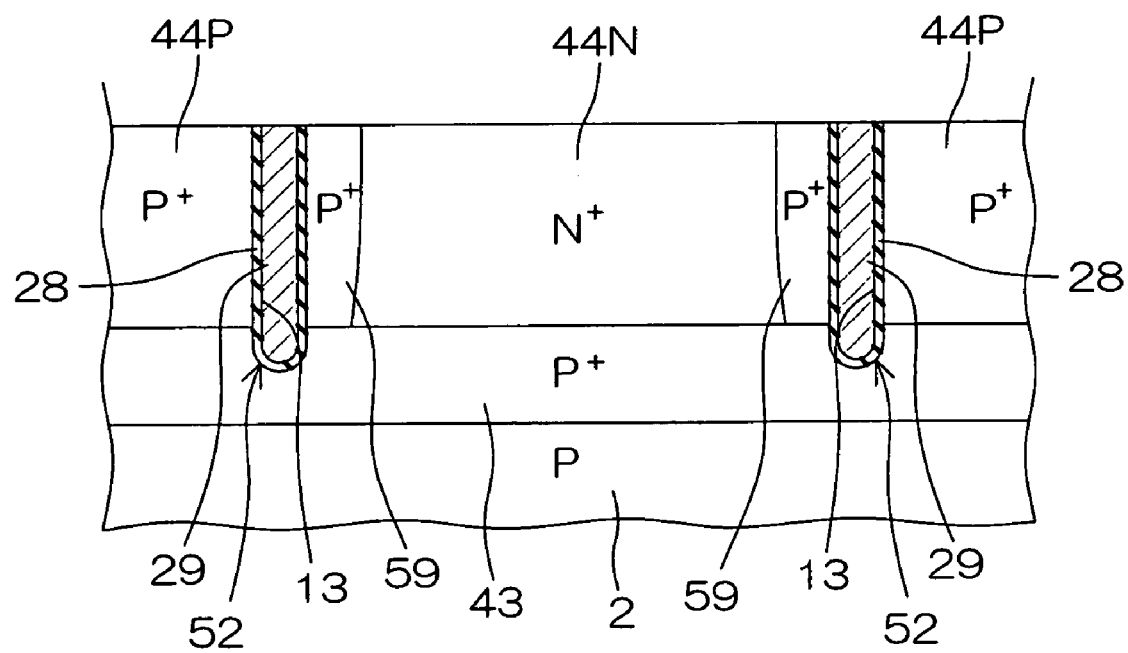

FIGS. 9(a) and 9(b) are schematic sectional views for explaining a production method for the image sensor 41 shown in FIGS. 6 to 8.

First, the step of forming the deep trench 13 filled with the polysilicon film 28 and the steps precedent to this step are performed in substantially the same manner as in the production process for the image sensor 1 according to the first embodiment (see FIGS. 4(a) to 4(c) and FIG. 9(a)), except that an N$^-$-type epitaxial layer 44 is formed on the silicon substrate 2 and the buried layer 43 is formed by introduction of a P-type impurity.

Then, a mask is formed on the epitaxial layer 44 as having openings in regions corresponding to epitaxial layers 44P and depletion layer limiting regions 59 (see FIG. 8), and then a P-type impurity is implanted into the epitaxial layer 44 through the openings of the mask.

Where the image sensor 41 is to be produced as having a pitch size of about 0.35 μm, the resulting substrate 2 is thereafter heated, for example, at 1000° C. for about 90 minutes. Thus, the P-type impurity implanted into the epitaxial layer 44 is diffused (thermally diffused) to reach the buried layer 43, whereby the epitaxial layers 44P and the depletion layer limiting regions 59 (P$^+$-type wells) are formed. The depletion layer limiting regions 59 formed by the implantation and thermal diffusion of the impurity each have a width which is smaller at the bottom thereof (on a side adjacent to the buried layer 43) than at the top thereof (on a side opposite from the buried layer 43) as shown in FIGS. 7, 8 and 9(b).

Where the image sensor 41 is to be produced as having a pitch size of about 0.23 μm, the formation of the depletion layer limiting regions 59 is achieved by causing the impurity to reach the buried layer 43 by the impurity implantation. The depletion layer limiting regions 59 formed by the impurity implantation without the thermal diffusion has a substantially uniform width from the top to the bottom thereof.

Referring to FIG. 8, anode regions 56 and cathode extraction regions 68 are each formed by implantation and diffusion of an impurity with the use of a mask having a predetermined opening pattern.

In turn, a silicon oxide film 60 is formed on the epitaxial layer 44, and openings are formed in the silicon oxide film 60 in predetermined positions corresponding to first anode electrodes 55a and first cathode electrodes 54a. Subsequently, a metal material is filled in the openings to form the first anode electrodes 55a and the first cathode electrodes 54a.

Then, second anode electrodes 55b and second cathode electrodes 54b are formed in predetermined patterns so as to be respectively connected to the first anode electrodes 55a and the first cathode electrode 54a on the silicon oxide film 60. Thereafter, a silicon nitride film 61 is formed on the silicon oxide film 60 as covering the second anode electrodes 55b and the second cathode electrodes 54b. Thus, the image sensor 41 shown in FIGS. 6 to 8 is provided.

In the image sensor 1 according to the first embodiment, N$^+$-type depletion layer limiting regions 39 (as indicated by two-dot-and-dash lines in FIGS. 2 and 3) may be provided between the deep trench 13 and the epitaxial layers 4P.

In this case, even if defective potentials are present in the vicinity of interfaces between the depletion layer limiting regions 39 of silicon and the silicon oxide film 28 around the deep trench 13, depletion layers are prevented from spreading into regions in which the defective potentials are present. This eliminates the possibility that carriers are trapped by the defective potentials to remain as residual charges, so that the photoelectric currents occurring in the respective sensor portions 10 are not influenced by the residual charges.

The formation of the depletion layer limiting regions 39 is achieved, for example, by implanting an N-type impurity into predetermined regions of the epitaxial layer 4 corresponding to the depletion layer limiting regions 39 and thermally diffusing the implanted impurity when the N-type impurity is implanted into regions of the epitaxial layer 4 corresponding to the non-sensor regions 26 and thermally diffused for the formation of the epitaxial layers 4N or after the formation of the epitaxial layers 4N.

In an image sensor (see FIGS. 5(a) to 5(c)) including an isolation region having a deep trench 13 and a shallow trench 31, N$^+$-type depletion layer limiting regions 39 (as indicated by two-dot-and-dash lines in FIGS. 5(b) and 5(c)) may be provided between the deep trench 13 and the epitaxial layers 4P.

In this case, the formation of the depletion layer limiting regions 39 is achieved, for example, by forming the deep trench 13, implanting an N-type impurity into predetermined regions of the epitaxial layer 4 corresponding to the depletion layer limiting regions 39 and thermally diffusing the implanted impurity.

While the embodiments of the present invention have thus been described, the invention may be embodied in any other ways. For example, the semiconductor portions of the image sensor 1, 41 may each have an opposite conductivity type. That is, the P-type portions in the a foresaid embodiments may each have an N conductivity type, and vice versa.

The sensor portions 10, 50 are not necessarily required to each include the photodiode 22, 62. In this case, only the surface photodiode 24, 64 receives light to generate photovoltaic power.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2003-188394 filed with the Japanese Patent Office on Jun. 30, 2003, the disclosure thereof being incorporated herein by reference.

What is claimed is:

1. An image sensor, comprising:
a plurality of photodiodes arranged on a surface of a semiconductor substrate, the photodiodes each including a first region of a first conductivity type provided on the semiconductor substrate, a second region of a second conductivity type provided on the first region, the second conductivity type being different from the first conductivity type, and a signal extraction region of the second conductivity type provided on the second region;
an isolation region which electrically isolates the second regions of each adjacent pair of photodiodes from each other, the isolation region including a first trench provided between the second regions of the adjacent photodiodes and an oxide film provided on the first trench in the vicinity of surfaces of the second regions and having a greater width than the first trench; and
third regions of the first conductivity type each provided between the second region and the oxide film for permitting a depletion layer to spread only outside a predetermined region adjacent to the oxide film when a reverse bias voltage having a predetermined magnitude is applied to each of the photodiodes.

2. An image sensor, comprising:
a plurality of photodiodes arranged on a surface of a semiconductor substrate, the photodiodes each including a first region of a first conductivity type provided on the semiconductor substrate, a second region of a second conductivity type provided on the first region, the second conductivity type being different from the first conductivity type, and a signal extraction region of the second conductivity type provided on the second region;
an isolation region which electrically isolates the second regions of each adjacent pair of photodiodes from each other, the isolation region including a first trench provided between the second regions of the adjacent photodiodes and an oxide film provided on the first trench in the vicinity of surfaces of the second regions and having a greater width than the first trench; and
a depletion layer limiting region of the first conductivity type provided between the second region and the first trench for permitting a depletion layer to spread only outside a predetermined region adjacent to the first trench when a reverse bias voltage having a predetermined magnitude is applied to each of the photodiodes.

3. An image sensor comprising:
a plurality of photodiodes arranged on a surface of a semiconductor substrate, the photodiodes each comprising a first region of a first conductivity type provided on the semiconductor substrate, a second region of a second conductivity type provided on the first region, the second conductivity type being different from the first conductivity type, and a signal extraction region of the second conductivity type provided on the second region;
an isolation region which electrically isolates the second regions of each adjacent pair of photodiodes from each other, the isolation region comprising a first trench provided between the second regions of the adjacent photodiodes; and
a depletion layer limiting region of the first conductivity type provided between the second region and the first trench for permitting a depletion layer to spread only outside a predetermined region adjacent to the first trench when a reverse bias voltage having a predetermined magnitude is applied to each of the photodiodes.

4. An image sensor, comprising:
a plurality of photodiodes arranged on a surface of a semiconductor substrate, the photodiodes each including a first region of a first conductivity type provided on the semiconductor substrate, a second region of a second conductivity type provided on the first region, the second conductivity type being different from the first conductivity type, and a signal extraction region of the second conductivity type provided on the second region; and
an isolation region which electrically isolates the second regions of each adjacent pair of photodiodes from each other, the isolation region including a first trench provided between the second regions of the adjacent photodiodes and an oxide film provided on the first trench in the vicinity of surfaces of the second regions and having a greater width than the first trench,
wherein the first trench has a deep trench isolation structure.

5. An image sensor, comprising:
a plurality of photodiodes arranged on a surface of a semiconductor substrate, the photodiodes each including a first region of a first conductivity type provided on the semiconductor substrate, a second region of a second conductivity type provided on the first region, the second conductivity type being different from the first conductivity type, and a signal extraction region of the second conductivity type provided on the second region;
an isolation region which electrically isolates the second regions of each adjacent pair of photodiodes from each other, the isolation region including a first trench provided between the second regions of the adjacent photodiodes and an oxide film provided on the first trench in the vicinity of surfaces of the second regions and having a greater width than the first trench; and
a power source for applying a reverse bias voltage to the photodiodes.

6. An image sensor as set forth in claim 5, wherein the second regions of the respective photodiodes are substantially completely depleted when a reverse bias voltage having a predetermined magnitude is applied to the photodiodes by the power source.

7. An image sensor, comprising:
a plurality of photodiodes arranged on a surface of a semiconductor substrate, the photodiodes each including a first region of a first conductivity type provided on the semiconductor substrate, a second region of a second conductivity type provided on the first region, the second conductivity type being different from the first conductivity type, and a signal extraction region of the second conductivity type provided on the second region;
an isolation region which electrically isolates the second regions of each adjacent pair of photodiodes from each other, the isolation region including a first trench provided between the second regions of the adjacent photodiodes and an oxide film provided on the first trench in the vicinity of surfaces of the second regions and having a greater width than the first trench; and
a first region electrode provided on the surface of the semiconductor substrate provided with the photodiodes outside a photodiode arrangement region in which the photodiodes are arranged, the first region electrode being electrically connected to the first regions of the respective photodiodes.

8. An image sensor as set forth in claim 7, further comprising a conductive region of the first conductivity type provided outside the photodiode arrangement region, the conductive region electrically connecting the first regions to the first region electrode.

9. An image sensor, comprising:
a plurality of photodiodes arranged on a surface of a semiconductor substrate, the photodiodes each including a first region of a first conductivity type provided on the semiconductor substrate, a second region of a second conductivity type provided on the first region, the second conductivity type being different from the first conductivity type, and a signal extraction region of the second conductivity type provided on the second region; and
an isolation region which electrically isolates the second regions of each adjacent pair of photodiodes from each other, the isolation region including a first trench provided between the second regions of the adjacent photodiodes and an oxide film provided on the first trench in the vicinity of surfaces of the second regions and having a greater width than the first trench;
wherein the first regions of the respective photodiodes are provided as a continuous first region which extends across the photodiodes and is shared by the photodiodes.

10. An image sensor, comprising:
a plurality of photodiodes arranged on a surface of a semiconductor substrate, the photodiodes each including a first region of a first conductivity type provided on the semiconductor substrate, a second region of a second conductivity type provided on the first region, the second conductivity type being different from the first conductivity type, and a signal extraction region of the second conductivity type provided on the second region;
an isolation region which electrically isolates the second regions of each adjacent pair of photodiodes from each other, the isolation region including a first trench provided between the second regions of the adjacent photodiodes and an oxide film provided on the first trench in the vicinity of surfaces of the second regions and having a greater width than the first trench; and
a plurality of surface photodiodes each constituted by the second region and a fourth region of the first conductivity type provided on the second region.

11. An image sensor as set forth in claim 10, wherein the fourth regions of the respective surface photodiodes are commonly connected.

12. An image sensor as set forth in claim 10, wherein the fourth region is configured so as to surround the signal extraction region.

13. An image sensor, comprising:
a plurality of photodiodes arranged on a surface of a semiconductor substrate, the photodiodes each including a first region of a first conductivity type provided on the semiconductor substrate, a second region of a second conductivity type provided on the first region, the second conductivity type being different from the first conductivity type, and a signal extraction region of the second conductivity type provided on the second region; and
an isolation region which electrically isolates the second regions of each adjacent pair of photodiodes from each other, the isolation region including a first trench provided between the second regions of the adjacent photodiodes and an oxide film provided on the first trench in the vicinity of surfaces of the second regions and having a greater width than the first trench;
wherein polysilicon is filled in the first trench.

14. A method for forming an isolation structure in an image sensor including a plurality of photodiodes each comprising a first region of a first conductivity type and a second region of a second conductivity type different from the first conductivity type for electrically isolating the second regions of the respective photodiodes from each other, the isolation structure formation method comprising the steps of:
forming a semiconductor layer of the second conductivity type on a first region of the first conductivity type formed on a surface of a semiconductor substrate;
forming a first trench extending through the semiconductor layer along the thickness of the semiconductor layer; and
oxidizing a portion of a surface of the semiconductor layer adjacent to the first trench to form an oxide film having a greater width than the first trench, whereby the semiconductor layer is divided by an isolation region constituted by the first trench and the oxide film to form second regions.

15. A method for forming an isolation structure in an image sensor as set forth in claim 14, further comprising the step of filling a filler in the first trench.

16. A method for forming an isolation structure in an image sensor as set forth in claim 15,
wherein the filler filling step includes the step of filling a semiconductor filler in the first trench,
wherein the oxide film formation step includes the step of oxidizing an upper portion of the filler filled in the first trench to form the oxide film.

17. A method for forming an isolation structure in an image sensor including a plurality of photodiodes each comprising a first region of a first conductivity type and a second region of a second conductivity type different from the first conductivity type for electrically isolating the second regions of the respective photodiodes from each other, the isolation structure formation method comprising the steps of:
forming a semiconductor layer of the second conductivity type on a first region of the first conductivity type formed on a surface of a semiconductor substrate;
forming a second trench extending to a thicknesswise middle portion of the semiconductor layer in a surface of the semiconductor layer; and
forming a first trench extending through the semiconductor layer along the thickness of the semiconductor layer and having a smaller width than the second trench in a region in which the second trench is formed, whereby the semiconductor layer is divided by an isolation region constituted by the first trench and the second trench to form second regions.

18. A method for forming an isolation structure in an image sensor as set forth in claim 17, further comprising the step of filling a filler in the second trench.

19. A method for forming an isolation structure in an image sensor including a plurality of photodiodes each comprising a first region of a first conductivity type and a plurality of second regions of a second conductivity type different from the first conductivity type for electrically isolating the second regions from each other, the method comprising the steps of:

forming a semiconductor layer of the second conductivity type different from the first conductivity type on a first region of the first conductivity type formed on a surface of a semiconductor substrate;

forming a first trench extending through the semiconductor layer along the thickness of the semiconductor layer so that the semiconductor layer is divided by an isolation region including the first trench to form second regions; and introducing an impurity of the first conductivity type between the semiconductor layer and the first trench to form a depletion layer limiting region of the first conductivity type which permits a depletion layer to spread only outside a predetermined region adjacent to the first trench when a reverse bias voltage having a predetermined magnitude is applied to each of the photodiodes.

20. A method for forming an isolation structure in an image sensor as set forth in claim 17, further comprising the step of filling a filler in the first trench.

* * * * *